United States Patent [19]

Daniele

[11] Patent Number: 4,624,741

[45] Date of Patent: Nov. 25, 1986

[54] METHOD OF FABRICATING ELECTRO-MECHANICAL MODULATOR ARRAYS

[75] Inventor: Joseph J. Daniele, Pittsford, N.Y.

[73] Assignee: Xerox Corporation, Stamford, Conn.

[21] Appl. No.: 808,798

[22] Filed: Dec. 13, 1985

[51] Int. Cl.⁴ .................. H01L 21/306; B44C 1/22; C03C 15/00; C03C 25/06

[52] U.S. Cl. .................................. 156/645; 156/647; 156/653; 156/657; 156/662; 29/576 T; 29/580

[58] Field of Search ............... 156/645, 647, 651, 653, 156/657, 662; 29/576 W, 576 T, 580

[56] References Cited

U.S. PATENT DOCUMENTS

| | | | |
|---|---|---|---|
| 4,389,280 | 6/1983 | Müeller et al. | 156/645 |
| 4,433,470 | 2/1984 | Komeyama et la. | 156/647 X |
| 4,470,875 | 9/1984 | Poteat | 156/647 X |
| 4,510,016 | 4/1985 | Chi et al. | 156/653 X |
| 4,534,826 | 8/1985 | Goth et al. | 156/657 X |

*Primary Examiner*—Tom Wyse

*Attorney, Agent, or Firm*—Frederick E. McMullen

[57] ABSTRACT

Method of forming small electro-mechanical modulator chips each with a row of flexible light reflecting fingers which may be butted with other like chips to form a full width electro-mechanical array by forming a silicon dioxide layer on a silicon wafer, forming a conductive layer on the silicon dioxide layer, etching away the conductive layer except for discrete rows of fingers, etching the silicon dioxide layer to create a mask delineating a well below the fingers and line openings in the silicon dioxide at the points where the wafer is to be separated into chips, etching the wafer to open the well and form V-shaped grooves along the openings, cutting a groove in the other side of the wafer along a centerline parallel to, but offset from the centerline of each V-shaped shaped groove by an amount sufficient to allow the wafer (111) crystalline plane to extend from the V-shaped groove to the cut groove, and applying a downward force to the wafer to fracture the wafer along along the (111) plane and separate the wafer into chips.

8 Claims, 10 Drawing Figures

METHOD OF FABRICATING ELECTRO-MECHANICAL MODULATOR ARRAYS

The invention relates to an electro-mechanical modulator array, and more particularly, to a method of fabricating small chips of electro-mechanical modulator arrays for assembly with other like chips to form a longer composite electro-mechanical modulator array.

Electro-mechanical modulator arrays, which are typically used to expose or write images in accordance with an image signal input, have a row of flexible fingers together with suitable supporting circuitry integrated onto a silicon substrate or chip. The fingers, which are supported by one end in cantilever fashion and are thus free to bend or deflect on the application of a voltage, have mirror-like reflecting surfaces on the finger exterior. When placed in the path of a high intensity beam such as a laser beam, selective application of a voltage to the fingers in response to an image signal input causes those fingers to deflect so that the portion of the beam striking the fingers is reflected in along a path different from the path followed by the beam portions which strike the remaining undeflected fingers. By optically focusing light in one of the paths on a recording member such as the photoreceptor of a xerographic system, the recording member is exposed across an image line. When coupled with concurrent movement of the recording member, a succession of image lines are exposed to form an image page which is thereafter developed and transferred from the recording member to a copy sheet to provide a visible copy of the image.

The image resolution achieved is proportional to the ratio of the scan width and the number of fingers that are in the array. Because of the difficulty in economically designing and fabricating long finger arrays with closely packed fingers, present day image resolution is relatively poor since only a single array with only a limited number of fingers is spread by optical magnification across the entire image line.

When a single array is used for imaging purposes, the image resolution achieved is a function of the number of fingers that can be fabricated on the chip surface divided by the width of the image line. Since the size of the chip is limited by integrated circuit fabrication yields, it would be advantageous if several smaller chips could be butted together end to end to form a longer array, and preferably to form a full width or full size array whose exposure area is coextensive with the width of the image line.

If a full width finger array could be formed by butting many smaller chips together, the desirable high resolution could be obtained. However, this means that the fingers must extend to the very end of the chip if continuity and minimal spacing or gap between the chips is to be assured. Otherwise, unacceptale distortion of the image will occur. While scribing and cleaving of silicon wafers are used by the semiconductor industry to produce chips having reasonably controlled dimensions, the microscopic damage that occurs to the chip surface during the scribing operation has heretofore effectively precluded the disposition of working components such as the operating fingers of an electro-mechanical modulator at the chip edge. Instead, it has required that a safe distance be maintained between the last finger and the chip edge if operation of those fingers at the chip is not to be impaired. In addition, if the size of aspect ratio (i.e. length/width) of the chip is beyond certain limits, the scribe-then-cleave process intoduces a risk of breaking the chips, leading to very low chip yields. As a result, known chip forming techniques fail in this special case of fabricating smaller long narrow chips capable of being butted with other like chips to form longer composite electro-mechanical modulator arrays.

The present invention seeks to address and rectify the above by providing a method of fabricating small chips of flexible fingers which can be accurately abutted end to end with other like chips to form a longer composite finger array, in which the steps comprise: forming a silicon dioxide layer on one side of a (100) silicon wafer; masking the one side with a mask defining a row of fingers extending longitudinally along the wafer in closely spaced side by side relation and chip separation lines running between adjoining pairs of fingers defining the points where the chips are to be separated from the wafer; etching the masked area to delineate the fingers and create line openings in the silicon dioxide where the chip separation lines are; using the etched silicon dioxide as a mask, etching the wafer to form a well below one of the fingers into which the fingers can deflect and form small V-shaped grooves in the line openings in the silicon dioxide, the walls of the V-shaped grooves paralleling the (111) crystalline plane of the wafer; forming as by saw cutting a relatively wide groove in the opposite side of the wafer parallel to and offset from each V-shaped groove by an amount such that the (111) plane in which one wall of the adjoining V-shaped groove lays intercepts the wide groove at substantially the midpoint of the groove, the depth of the wide grooves being limited to prevent the side grooves or saw damage from reaching into the well; and applying a downward bending force to the wafer proximate the V-shaped groove to cause the wafer to fracture between the finger pair and along the (111) plane from the V-shaped groove to the adjoining wide groove whereby to provide chips having uniformly flat precisely controlled ends defined by the base of the V-groove and the (111) plane.

IN THE DRAWINGS

Figure 1:
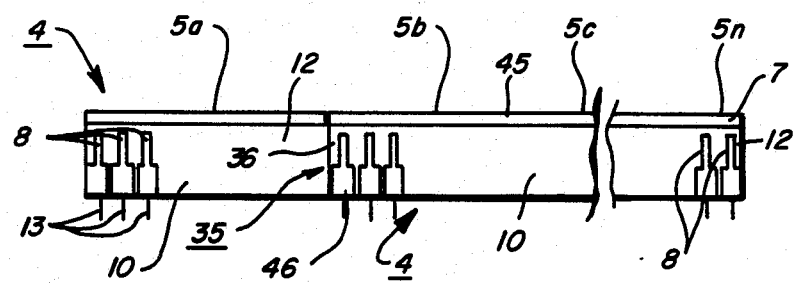
FIG. 1 is a top view illustrating a composite electro-mechanical modulator array composed of chips of several smaller arrays fabricated in accordance with the teachings of the invention and butted together forming a full width array.
Figure 2:
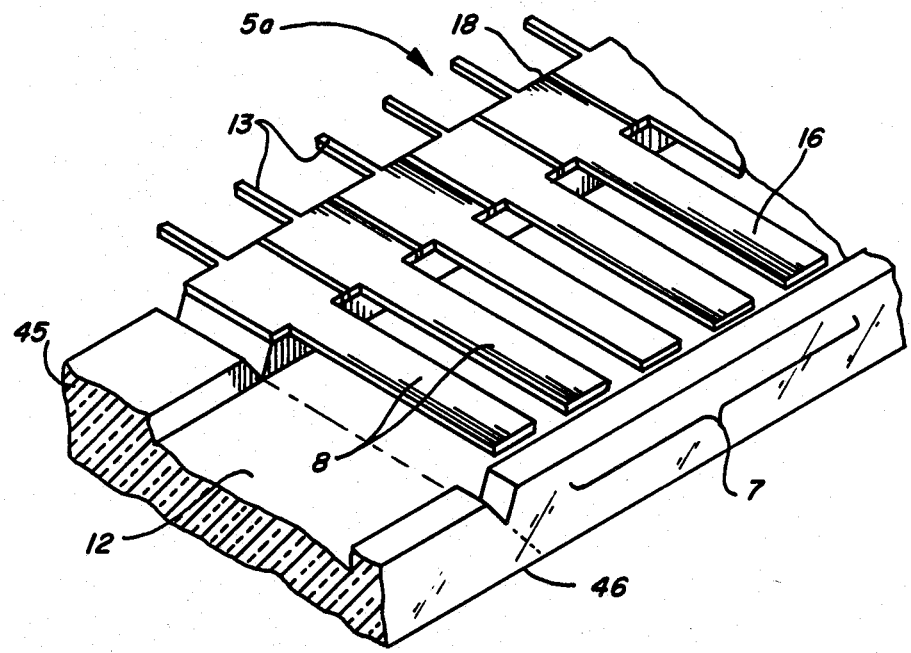
FIG. 2 is an isometric view of a portion of one of the chips in FIG. 1 showing details of the flexible finger construction.
Figure 3:
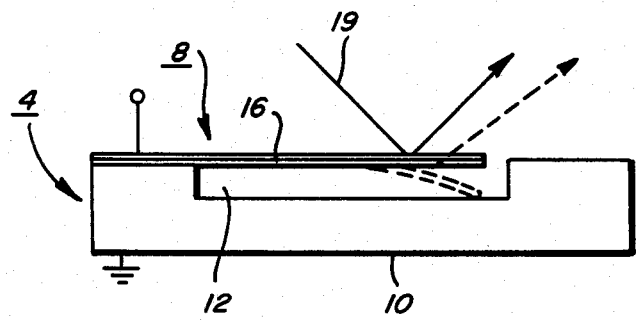
FIG. 3 is a side view in cross section of the chip shown in FIG. 2.

Referring particularly to FIGS. 1-3 of the drawings, there is shown a long or full width electro-mechanical modulator array 4 composed of a plurality of smaller modulator chips 5a, 5b, . . . 5n butted together end to end. Modulator chips 5a, 5b, . . . 5n, each comprise a row 7 of flexible fingers 8, which are typically silicon dioxide, supported in cantilever fashion on a silicon base 10. Typically, base 10 is relatively thin and has a generally rectangular shape, with ends 35, 36 and top and bottom edges 45, 46. The axis of the row 7 of fingers 8 parallels the longitudinal axis of base 10. While a single row 7 of fingers 8 is shown, plural finger rows may instead be contemplated. Other circuits such as shift registers, gates, clocks, etc. may also be formed integral with base 10. Suitable external connection electrodes 13 are also provided for electrically coupling the modulator chips 5a, 5b . . . 5n to related external circuitry.

To permit bending or flexing of fingers 8, base 10 has a generally longitudinally extending recess or well 12 below fingers 8. Fingers comprise relatively thin flexible membranes of silicon dioxide having a highly reflective conductive coating or layer 16 such as chromium and gold on the external surface thereof. Fingers 8 are electrically insulated from one another by gaps 18 therebetween.

Modulator chips 5a, 5b, . . . 5n, which are fabricated in accordance with the teachings of the present invention as will appear more fully hereinbelow, are typically used to expose an image line by line on a suitable recording member in response to an image signal input. Preferably, the array 4 of chips 5a, 5b, . . . 5n is a full length array having an overall length equal to or slightly greater than the width of the largest image line to be exposed. As will appear, modulator chips 5a, 5b, . . . 5n are fabricated so that the row 7 of fingers 8 of each chip extend to the ends 35, 36 of the chip so that when chips 5a, 5b, . . . 5n are butted together, there is formed a continuous and uninterrupted array 4. A modulator array 4 having some 3,000 fingers, each with a length of 100 μm, a width of 50 μm, and a thickness of 0.25 μm and spaced apart by a distance of 5 μm, has been found suitable.

In use, fingers 8 respond to the imposition of a voltage across base 10 and the finger conductive layer 16. The resulting electrostatic force causes each finger to which the voltage is applied to bend or deflect downward (as shown by the dotted lines in FIG. 3), the degree of bending or deflection obtained being dependent upon the voltage applied. Typically, a maximum deflection of approximately 5 degrees is realized by the application of approximately 15 volts, the bending frequency of the fingers 8 being approximately 23 kHz.

As seen best in FIG. 3, array 4 is disposed astride the path of a high intensity beam such as generated by a laser, the beam having been optically processed to impinge a sheet-like beam of light 19 across the row 7 of fingers 8. By applying voltage to the fingers 8 in accordance with an image signal input, selective fingers 8 in the row 7 are deflected causing the portions of the beam striking the deflected fingers to reflect along a path different from the path followed by the remainder of the beam which strikes the non-deflected fingers. By collecting and focusing either of the deflected or non-deflected beams onto a recording member, a light image pattern corresponding to the image signal input is formed on the recording member across one image line. With concurrent movement of the recording member in a direction transverse to the direction of the image line, line by line exposure of the recording member is made to form an image represented by the image signals thereon. Following this, the image is developed on the recording member and transferred to a copy substrate such as a copy sheet. The unused or non-image portion of the beam may be impinged against a suitable stop.

Figure 4:
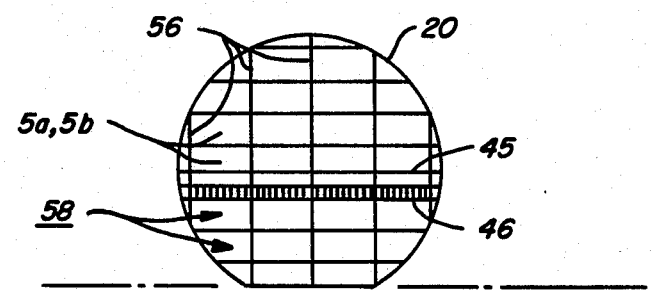
FIG. 4 is a top view of a silicon wafer prior to cleavage of individual chips therefrom.
Figure 5:
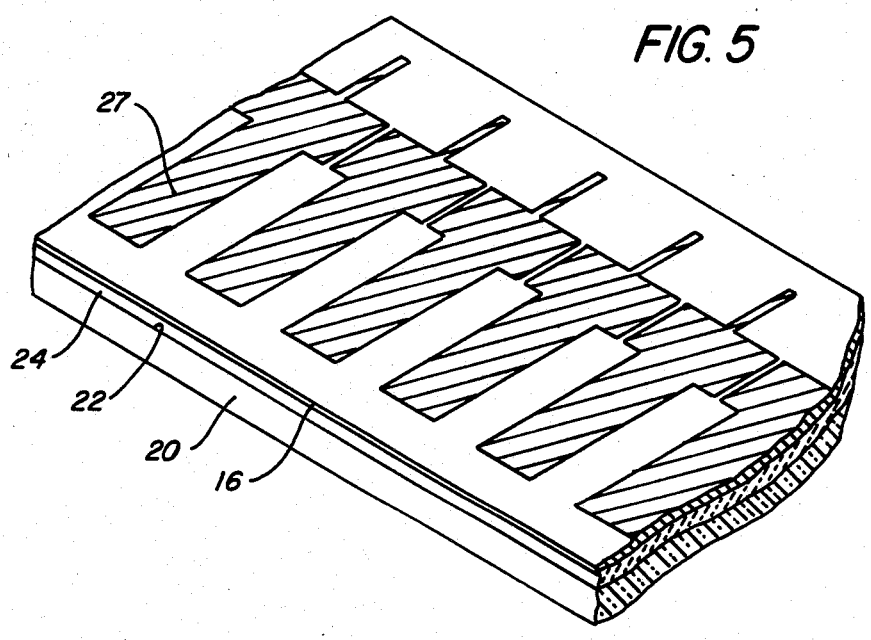
FIG. 5 is an isometric view depicting a mask delineating the fingers and external connecting electrodes prior to etching.
Figure 6:
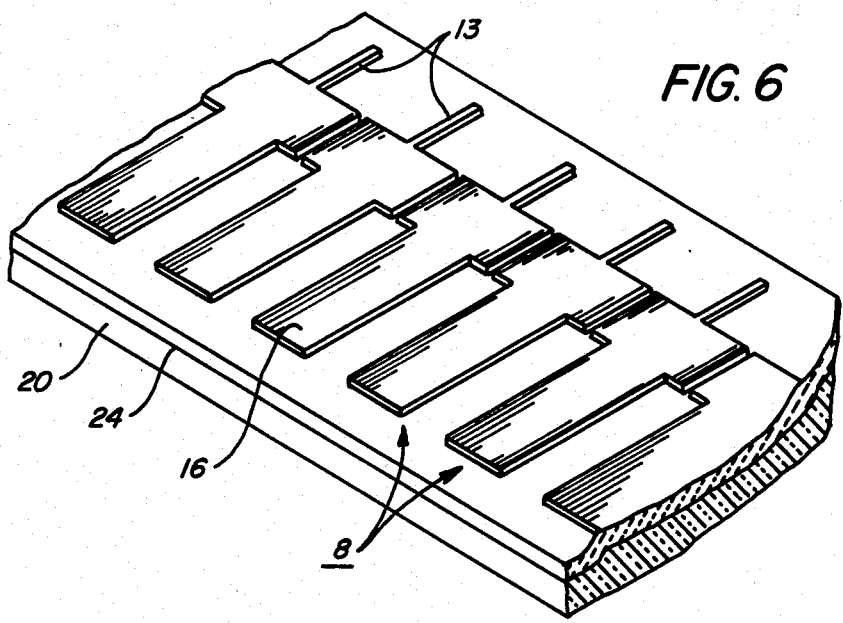
FIG. 6 is an isometric view depicting the partially formed chip with fingers and connecting electrodes after etching.

Referring to FIGS. 4 and 5, chips 5a, 5b, . . . 5n are fabricated from a larger wafer 20 of (100) silicon of the type commonly employed to make integrated circuits. One side 22 of wafer 20 has a silicon dioxide layer 24 grown thereon to a desired depth, for example 0.3 microns with chrome and gold (or other suitable metal combination) layer 16 deposited on the silicon dioxide. An integrated circuit mask 27, having an etch pattern delineating with particular accuracy the fingers 8 and the electrodes 13 is placed thereon using standard I.C. photolithographic techniques. Mask 27 is carefully aligned with the (110) crystalline axes of wafer 20. The metal layer 16 is then etched from everywhere except fingers 8 and the external connecting electrodes 13. FIG. 6 shows the fingers 8 and electrodes 13 following the etching of the metals.

Figure 7:
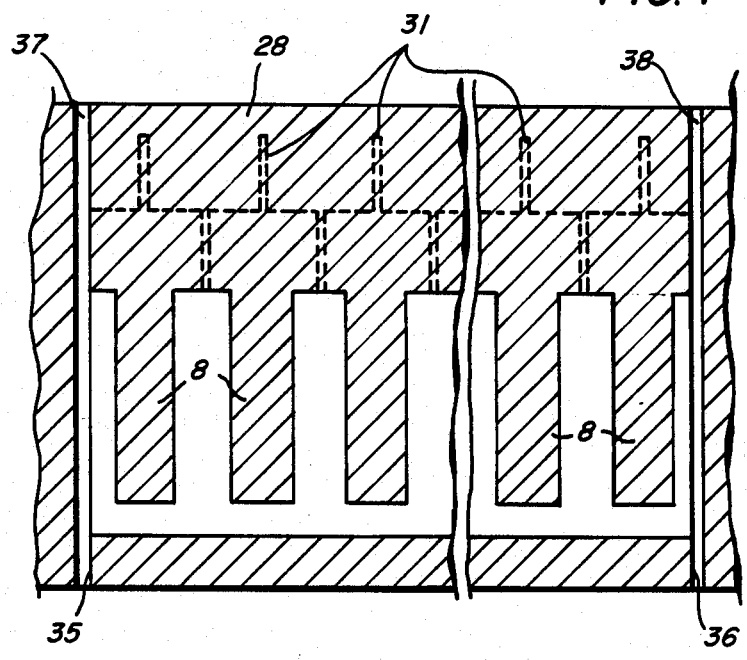
FIG. 7 is a top view depicting the partially formed chip shown in FIG. 6 with mask delineating the well below the fingers and the chip ends after etching.
Figure 8:
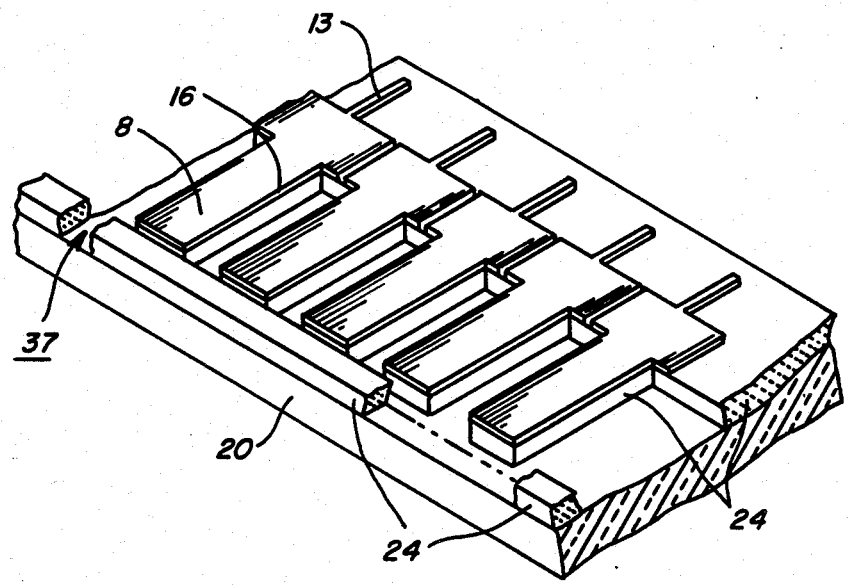
FIG. 8 is an isometric view depicting the partially formed chip following etching of the silicon dioxide.

Referring to FIG. 7, a second integrated circuit mask 28 is then also carefully aligned with the (110) crystalline axes. Again using photolithography, this mask delineates the boundaries of the well 12 under the fingers 8 and the opposite ends 35, 36 of the chips 5 with particular accuracy. With mask 28 in place, wafer 20 is etched using a suitable selective etchant such as hydrofloric acid. As shown in FIG. 8, etching removes the silicon dioxide layer 24 between and around that portion of the fingers 8 that are to extend over well 12 and forms line openings 37, 38 in the silicon dioxide defining the chip ends 35, 36.

Wafer 20 is then etched using a suitable and selective anisotropic etchant such as ethylene pyro catenol to remove the silicon below the fingers 8 to a desired depth and to form well 12. With the silicon removed below the portion of the fingers extending over well 12, there results a row of fingers having one end projecting in cantilever fashion above well 12 with the opposite end attached to the wafer 20 through the bond between the silicon wafer and the silicon dioxide of the finger. It will be understood that during this process, masking is not necessary since no appreciable etching of the silicon dioxide or metal occurs.

Etching of the silicon along the openings 37, 38 which define the ends 35, 36 of the chips may be carried out at the same time. Due to the crystalline structure of the silicon substrate, V-shaped (111) cleavage grooves 56 (seen in FIGS. 4 and 9) defining the chip ends 35, 36 result. Alternately, photolithographic delineating in the silicon dioxide and etching of grooves 56 may be carried out as a separate process.

Figure 9:
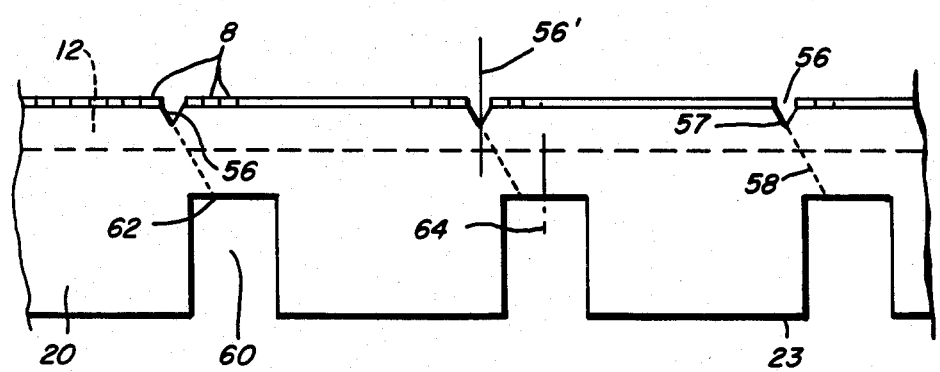
FIG. 9 is an enlarged side view in cross section of the chip after etching showing the bottom grooves in relation to the previously etched V-shaped cleavage grooves that define the chip ends.

Following completing of the etching cycle and referring particularly to FIG. 9, break grooves 60 are formed parallel to and in registration with the V-shaped grooves 56 in the opposite side 23 of wafer 20. Grooves 60, which may be formed for example by sawing, laser cutting, etc., have a depth such that the base 62 of the groove is spaced sufficiently far from the bottom of well 12 so as not to intrude or interfere with well 12 and with any other circuits integrated on or which may later be integrated on chips 5a, 5b, . . . 5n. The centerline 64 of break grooves 60 is deliberately offset from the centerline 56' of the V-shaped groove 56 by an amount sufficient to allow the extension of the (111) crystalline plane of the V-shaped groove to terminate near or adjacent the centerline or middle portion 64 of the break groove 60.

Figure 10:
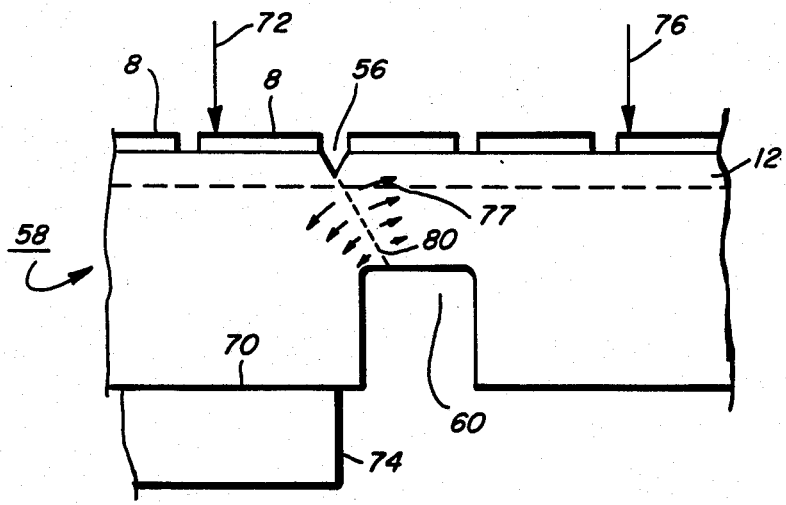
FIG. 10 is an enlarged side view in cross section illustrating the forces acting on the wafer during cleaving.

Referring now to FIGS. 4 and 10, at the completion of the process, chips 5a, 5b, . . . 5n are separated, for example, by sawing along the top and bottom edges 45, 46 of the chips so that there results a series of elongated strips 58, each comprising a row of chips.

To separate the individual chips from one another, the strip is held tightly agaist a flat surface 70 by means of a suitable retaining force 72. Strip 58 is positioned on surface 70 so that the outer edge 74 of surface 70 parallels and is spaced slightly from the V-shaped groove 56 and the break groove 60 associated therewith at the point where cleavage is to be made. To cleave or separate the chips from strip 58, a downward bending force 76 is exerted on the outwardly projecting end of the strip causing cleavage fractures (designated by the numeral 77) to initiate at the bottom of groove 56 and naturally propagate along the crystalline plane 80 of the wafer from the bottom of groove 56 to groove 60. Following separation of the chip from the strip, the strip is moved or indexed forward to the next cleavage point and the process repeated until all of the chips are separated from the strip.

As a result, the ends 35, 36 of chips 5a, 5b, . . . 5n are formed with uniformly flat and smooth surfaces. The surfaces of the chip ends precisely defines the chip end boundaries, enabling one chip to be abutted against and joined with other chips end to end to form a long array 4 of chips.

As will be understood, cleaving of the chips 5a, 5b, . . . 5n along the (111) crystalline plane 80 undercuts to some degree the portion of the silicon base 10 and well 12 under the finger adjoining one end of the chip, reducing the ground plane for that finger. However, as each chip is abutted against and joined with the mating end of the next chip, the lost ground plane for the end finger is restored through the silicon base 10 of the adjoining chip.

While the invention has been described with reference to the structure disclosed, it is not confined to the details set forth, but is intended to cover such modifications or changes as may come within the scope of the following claims.

I claim:

1. A method of fabricating small chips of flexible finger arrays for abutting engagement with other like chips to form a longer composite finger array, said chips having a well under one end of each of said fingers into which individual fingers can deflect on application of a potential thereto, comprising the steps of:
   (a) forming a silicon dioxide layer on one side of a (100) silicon wafer;
   (b) forming a conductive and reflecting layer on said silicon dioxide layer;
   (c) masking said conductive layer with a mask defining at least one row of fingers extending longitudinally along said wafer in spaced side by side relation;
   (d) etching said wafer to remove said conductive layer except where masked;
   (e) masking said wafer with a mask outlining said well, said mask having line-like openings extending between selected pairs of fingers defining the ends of each of said chips;
   (f) etching said wafer to remove said silicon dioxide layer except where masked;
   (g) using the silicon dioxide as a mask, etching said wafer to form said well and separation grooves for the ends of said chips, said grooves having walls paralleling said wafer (111) crystalline planes;
   (h) forming a relatively wide groove in the opposite side of said wafer for each of said separation grooves, each of said wide grooves being parallel to and offset from its associated separation groove so that the (111) plane of said separation grooves intercepts the wide groove associated therewith, said separation grooves intercepting adjacent to the midpoint of said wide groove, the depth of said wide grooves being insufficient for said wide grooves to intercept said well; and
   (i) applying a downward bending force to said wafer proximate each of said V-shaped grooves to cause said wafer to fracture along the (111) plane between each separation groove and its associated wide groove whereby to provide individual chips having uniformly flat, precisely controlled ends.

2. The method according to claim 1 including the step of:
   masking said conductive layer with a mask defining said finger row and an electrode for coupling each of said fingers externally.

3. The method according to claim 1 including the step of:
   forming said conductive layer by depositing a metal on said silicon dioxide layer.

4. A method of fabricating small chips of flexible finger arrays for abutting engagement with other like chips to form a longer composite finger array, said chips having a well under one end of each of said fingers into which individual fingers can deflect on application of a potential thereto, comprising the steps of:
   (a) forming a silicon dioxide layer on one side of a (100) silicon wafer;
   (b) forming at least one row of fingers extending longitudinally along said wafer in spaced side by side relation;
   (c) masking said wafer with a mask outlining said well, said mask having line like openings extending between selected pairs of fingers defining the ends of each of said chips;
   (d) etching said wafer to remove said silicon dioxide layer except where masked;
   (e) using the silicon dioxide as a mask, etching said wafer to form said well and separation grooves for the ends of said chips, said grooves having walls paralleling said wafer (111) crystalline planes between said finger pairs where said chips are to be separated from said wafer;
   (f) forming a relatively wide groove in the opposite side of said wafer for each of said separation grooves, each of said wide grooves being parallel to and offset from its associated separation groove so that the (111) plane of said separation grooves intercepts the wide groove associated therewith adjacent the midpoint of said wide groove, the depth of said wide grooves being insufficient for said wide grooves to intercept said well; and
   (g) applying a downward bending force to said wafer proximate each of said V-shaped grooves to cause said wafer to fracture along the (111) plane between each separation groove and its associated wide groove whereby to provide individual chips having uniformly flat, precisely controlled ends.

5. The method according to claim 4 in which the step of forming said fingers includes:
   (a) forming a conductive layer on said silicon dioxide layer;
   (b) masking said conductive layer with a mask delineating said fingers; and
   (c) etching said wafer to remove all of said conductive layer except for said fingers.

6. A method of fabricating smaller chips of flexible finger arrays from a relatively large (100) silicon wafer to provide chips capable of being abutted end to end with other like chips to form a longer composite finger array, comprising the steps of:
   (a) forming a silicon dioxide layer on one side of said wafer;
   (b) forming a conductive layer on said silicon dioxide layer;
   (c) etching said wafer to remove said conductive layer except where said fingers are desired so that there results at least one row of said fingers on said wafer;
   (d) etching said wafer to remove discrete portions of said silicon dioxide layer to outline a well at the end of said fingers and create line openings in said silicon dioxide defining the points where said wafer is to be separated into individual chips;
   (e) using said etched silicon dioxide layer as a mask, etching said wafer to form said well and to form V-shaped separation grooves in said line openings, said separation grooves paralleling the (111) crystalline planes of said wafer;
   (f) forming a relatively wide groove in the opposite side of said wafer for each of said separation grooves, each of said wide grooves being parallel to and offset from its associated separation groove so that the (111) plane of said separation grooves intercepts the wide groove associated therewith adjacent the midpoint of said wide groove, the depth of said wide grooves being insufficient for said wide grooves to intercept said well; and
   (g) applying a downward bending force to said wafer proximate each of said V-shaped grooves to cause said wafer to fracture along the (111) plane between said separation groove and its associated wide groove whereby to provide individual chips having uniformly flat, precisely controlled ends.

7. A method of fabricating smaller chips of flexible finger arrays from a relatively large (100) silicon wafer to provide chips capable of being abutted end to end with other like chips to form a longer composite finger array, comprising the steps of:
   (a) forming a silicon dioxide layer on one side of said wafer;
   (b) forming a conductive layer on said silicon dioxide layer;
   (c) etching said wafer to remove said conductive layer except where said fingers are desired so that there results at least one row of said fingers on said wafer;
   (d) etching said wafer to remove discrete portions of said silicon dioxide layer to outline a well at the end of said fingers and create line openings in said silicon dioxide defining the points where said wafer is to be separated into individual chips;
   (e) using said etched silicon dioxide layer as a mask, etching said wafer to form said well;
   (f) etching said wafer to form V-shaped separation grooves in said line openings, said separation grooves paralleling the (111) crystalline planes of said wafer,
   (g) forming a relatively wide groove in the opposite side of said wafer for each of said separation grooves, each of said wide grooves being parallel to and offset from its associated separation groove so that the (111) plane of said separation grooves intercepts the wide groove associated therewith adjacent the midpoint of said wide groove, the depth of said wide grooves being insufficient for said wide grooves to intercept said well; and
   (h) applying a downward bending force to said wafer proximate each of said V-shaped grooves to cause said wafer to fracture along the (111) plane between said separation groove and its associated wide groove whereby to provide individual chips having uniformly flat, precisely controlled ends.

8. A method of fabricating smaller chips of flexible finger arrays from a relatively large (100) silicon wafer to provide chips capable of being abutted end to end with other like chips to form a longer composite finger array, comprising the steps of:
   (a) forming a silicon dioxide layer on one side of said wafer;
   (b) forming a conductive layer on said silicon dioxide layer;
   (c) etching said wafer to remove said conductive layer except where said fingers are desired so that there results at least one row of said fingers on said wafer;
   (d) forming relatively wide grooves in the opposite side of said wafer at the points where said wafer is to be separated into said small chips, said wide grooves paralleling the (111) crystalline plane of said wafer;
   (e) etching said wafer to remove discrete portions of said silicon dioxide layer to outline a well at the end of said fingers and create linelike voids in said silicon dioxide defining the points where said wafer is to be separated into individual chips;
   (f) using said etched silicon dioxide layer as a mask, etching said wafer to form said well and to form V-shaped separation grooves in said voids, said separation grooves paralleling the (111) crystalline planes of said wafer, each of said separation grooves being laterally offset from its associated wide groove so that one wall of said separation groove is coplanar with its associated wide groove; and
   (g) applying a downward bending force to said wafer proximate each of said V-shaped grooves to cause said wafer to fracture along the (111) plane between said separation groove and its associated wide groove whereby to provide individual chips having uniformly flat, precisely controlled ends.

* * * * *